(12) United States Patent
Ohira et al.

(10) Patent No.: US 11,158,483 B2
(45) Date of Patent: Oct. 26, 2021

(54) CHARGED PARTICLE BEAM DEFLECTION DEVICE

(71) Applicant: KABUSHIKI KAISHA TOSHIBA, Tokyo (JP)

(72) Inventors: Kazuya Ohira, Nerima Tokyo (JP); Hideto Furuyama, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/012,656

(22) Filed: Sep. 4, 2020

(65) Prior Publication Data

US 2021/0287873 A1 Sep. 16, 2021

(30) Foreign Application Priority Data

Mar. 11, 2020 (JP) .............................. JP2020-041835

(51) Int. Cl.
*H01J 37/147* (2006.01)
*H01J 37/317* (2006.01)
*H01J 37/24* (2006.01)
*H01J 37/04* (2006.01)

(52) U.S. Cl.
CPC .......... *H01J 37/147* (2013.01); *H01J 37/045* (2013.01); *H01J 37/24* (2013.01); *H01J 37/3177* (2013.01); *H01J 2237/0437* (2013.01)

(58) Field of Classification Search
CPC ...... H01J 37/147; H01J 37/3177; H01J 37/24; H01J 37/045; H01J 2237/0437

USPC ................................ 250/396 R, 492.1–492.3
See application file for complete search history.

(56) References Cited

U.S. PATENT DOCUMENTS

| | | | |
|---|---|---|---|
| 8,604,411 B2 * | 12/2013 | Wieland | B82Y 10/00 250/216 |
| 2004/0140432 A1 * | 7/2004 | Maldonado | H01J 37/073 250/423 P |
| 2005/0062950 A1 | 3/2005 | van 't Spijker et al. | |
| 2019/0295809 A1 | 9/2019 | Furuyama | |

FOREIGN PATENT DOCUMENTS

JP 4664293 B2 4/2011
JP 2019-165188 A 9/2019

* cited by examiner

*Primary Examiner* — Michael Maskell
(74) *Attorney, Agent, or Firm* — Finnegan, Henderson, Farabow, Garrett & Dunner L.L.P.

(57) ABSTRACT

A charged particle beam deflection device includes a substrate; a plurality of apertures provided in the substrate; a plurality of electrodes deflecting charged particle beams passing through the apertures; a plurality of light-receiving elements controlling voltages applied to the plurality of electrodes; a first optical coupler coupling continuous light to the substrate; a light distributor distributing light coupled by the first optical coupler into a two-dimensional plane; a plurality of modulators performing intensity modulation of light distributed by the light distributor; and a plurality of second optical couplers coupling the modulated light to the light-receiving elements.

11 Claims, 5 Drawing Sheets

CHARGED PARTICLE BEAM DEFLECTION DEVICE

CROSS-REFERENCE TO RELATED APPLICATION

This application is based upon and claims the benefit of priority from Japanese Patent Application No. 2020-041835, filed on Mar. 11, 2020; the entire contents of which are incorporated herein by reference.

FIELD

Embodiments described herein relate generally to a charged particle beam deflection device.

BACKGROUND

For example, a lithography device that uses an electron beam is being developed in which multi-electron beams are used for higher throughput. It has been proposed to use optical wiring that includes optical waveguides as the blanking control signal wiring of a BAA (Blanking Aperture Array) substrate to cope with higher control signal wiring densities due to a higher number of beams and a narrower beam pitch.

DETAILED DESCRIPTION

Figure 1:
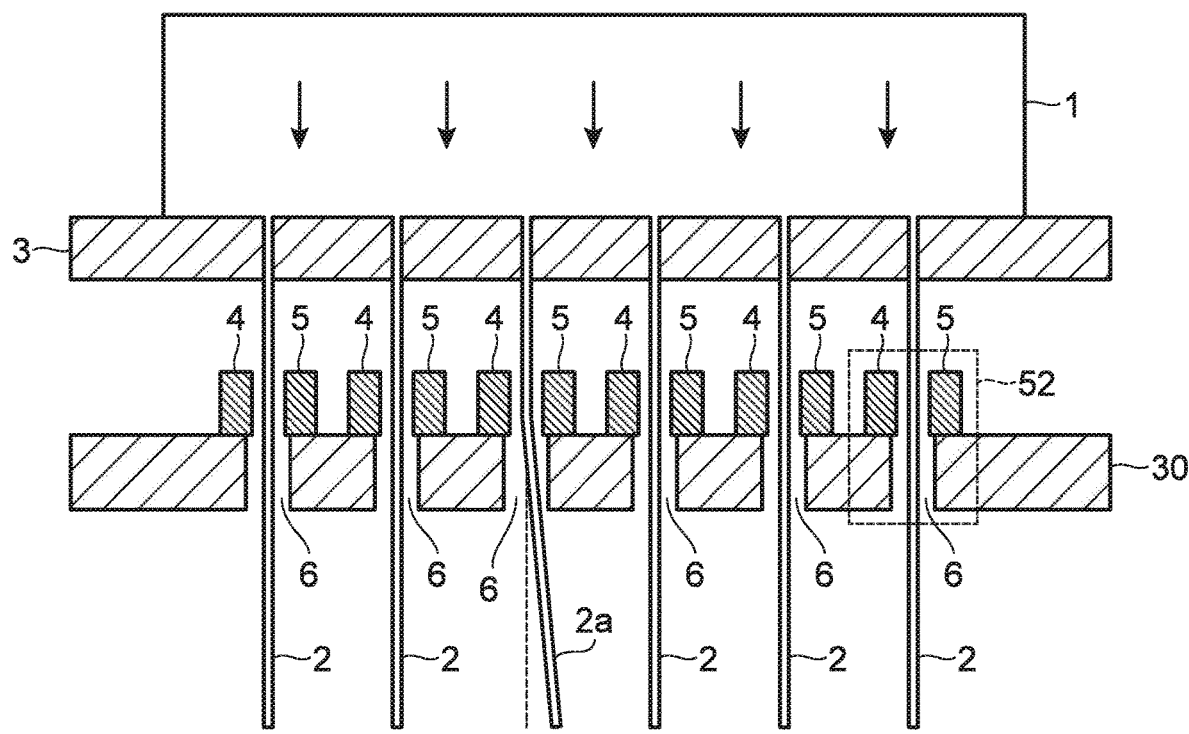
FIG. 1 is a schematic cross-sectional view of a charged particle beam deflection device of an embodiment.

According to one embodiment, a charged particle beam deflection device includes a substrate; a plurality of apertures provided in the substrate; a plurality of electrodes deflecting charged particle beams passing through the apertures; a plurality of light-receiving elements controlling voltages applied to the plurality of electrodes; a first optical coupler coupling continuous light to the substrate; a light distributor distributing light coupled by the first optical coupler into a two-dimensional plane; a plurality of modulators performing intensity modulation of light distributed by the light distributor; and a plurality of second optical couplers coupling the modulated light to the light-receiving elements.

Embodiments will now be described with reference to the drawings. The same components in the drawings are marked with the same reference numerals.

Although a deflection device of an electron beam mainly is described in the embodiment, the invention is also practicable in a deflection device of another charged particle beam such as an ion beam or the like.

To perform multi-electron beam lithography, it is necessary to split the electron beam and perform individual blanking (ON/OFF) control of the split electron beams; and a blanker array that corresponds to the split electron beams is necessary. For example, beam deflectors are used as blankers, and substantial electron beam blanking is performed by causing the deflected electron beams to miss the imaging surface.

FIG. 1 is a schematic cross-sectional view of a charged particle beam deflection device of an embodiment.

The charged particle beam deflection device of the embodiment includes a substrate 3 that includes a SAA (Shaping Aperture Array), a substrate 30 that includes a BAA (Blanking Aperture Array), and a beam deflector (a blanker) 52. Multiple apertures 6 are formed in the substrate 30.

An input electron beam 1 is extracted from an electron gun (not illustrated) and accelerated. The substrate 3 splits the input electron beam 1 into multi-electron beams 2 and aligns the beam shape. One beam deflector (blanker) 52 includes an electrode pair including a deflection electrode 5 and a counter electrode 4. A pair of the counter and deflection electrodes 4 and 5 is provided to correspond to one aperture 6.

The substrate 3 converts the input electron beam 1 into the multi-electron beams 2 that reflect the shape and the arrangement of the apertures formed in the substrate 3. The multi-electron beams 2 travel straight as-is while maintaining the prescribed beam array, are controlled by a total deflection electrode (not illustrated) and an electron beam lens (not illustrated), are reduced, and are irradiated on an exposure surface (not illustrated).

For example, when a positive voltage is applied to the third deflection electrode 5 from the left in FIG. 1 and an electron beam 2a passing through the aperture 6 corresponding to this deflection electrode 5 is deflected, a pattern in which the electron beam 2a is blanked is projected onto the exposure surface. The blanked electron beam 2a travels toward a different direction from the non-deflected beams so that the electron beam 2a cannot pass through a pupil provided in front of the exposure surface (an aperture stop provided at an intermediate convergence point vicinity of the entire beam) and is blocked by the pupil member.

Figure 2:
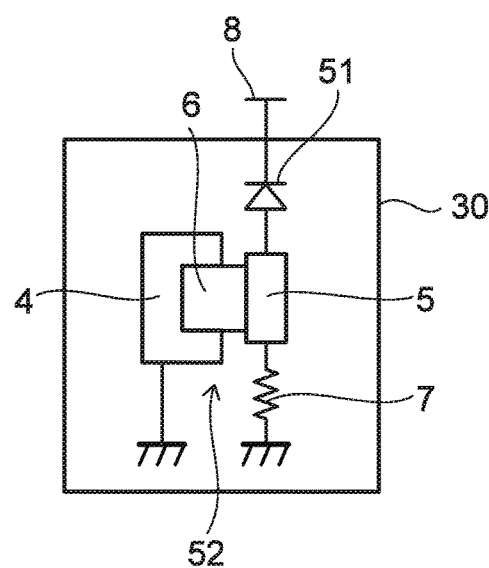
FIG. 2 is a schematic top view of a portion including one blanker in the charged particle beam deflection device of the embodiment.

FIG. 2 is a schematic top view of a portion including one blanker 52.

The blanker 52 includes the deflection electrode 5, the counter electrode 4, the aperture 6, and a load resistance 7. One light-receiving element 51 is provided at the substrate 30 to correspond to one blanker 52.

For example, the counter electrode 4 is grounded. The light-receiving element 51 is connected to power supply wiring 8. The deflection electrode 5 is connected to the light-receiving element 51 and the load resistance 7. The light-receiving element 51 controls a voltage applied to the deflection electrode 5.

As described below, the light-receiving element 51 receives the input of modulated light (an optical signal)

corresponding to the blanking control signal. The modulated light is converted into a current by the light-receiving element 51. The current is converted into a voltage by the load resistance 7, and a prescribed voltage is applied to the deflection electrode 5. At this time, the electron beam that passes through the aperture 6 is deflected by an electric field, which is determined by the distance and the potential difference between the deflection electrode 5 and the counter electrode 4. In the embodiment, for example, the modulated light is directly converted into the drive voltage of the deflection electrode 5 as an analog (continuous) amount.

When the modulated light stops, the light-receiving element 51 no longer generates the current; the charge that is stored in the parasitic capacitance of the deflection electrode 5 and the light-receiving element 51 is discharged via the load resistance 7; and the voltage applied to the deflection electrode 5 decreases. At this time, in the case where one end of the load resistance 7 is grounded, the deflection electrode 5 also is set to the ground potential; the electric field between the deflection electrode 5 and the counter electrode 4 becomes zero; and the electron beam that passes through the aperture 6 travels straight.

Figure 3:
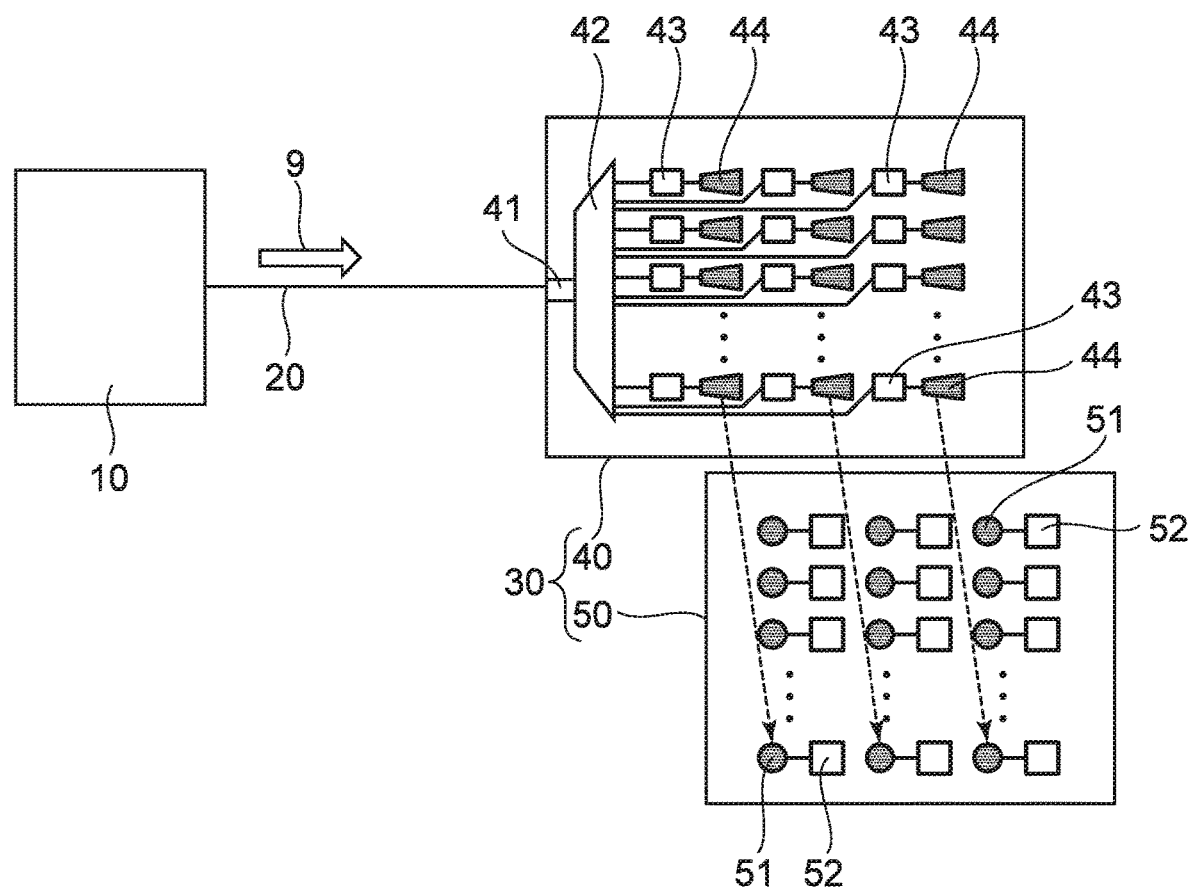
FIG. 3 is a schematic configuration diagram of the charged particle beam deflection device of the embodiment.

FIG. 3 is a schematic configuration diagram of the charged particle beam deflection device of the embodiment.

The charged particle beam deflection device of the embodiment includes the substrate 30, a first optical coupler 41, a light distributor 42, multiple modulators 43, multiple second optical couplers 44, the multiple light-receiving elements 51, and the multiple blankers 52.

The substrate 30 includes a first substrate 50 and a second substrate 40. The multiple light-receiving elements 51 and the multiple blankers 52 are provided at the first substrate 50. The first optical coupler 41, the light distributor 42, the multiple modulators 43, and the multiple second optical couplers 44 are provided at the second substrate 40.

The first optical coupler 41 couples, to the second substrate 40, continuous light 9 output by a light source 10. The light source 10 is, for example, a semiconductor laser and continues to output the continuous light 9 of a constant intensity. The light source 10 and the first optical coupler 41 are connected by an optical fiber 20.

Figure 4A:
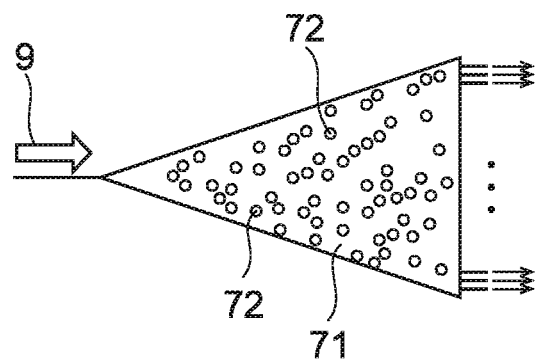
FIGS. 4A to 4C are schematic views of a light distributor in the charged particle beam deflection device of the embodiment.
Figure 4B:
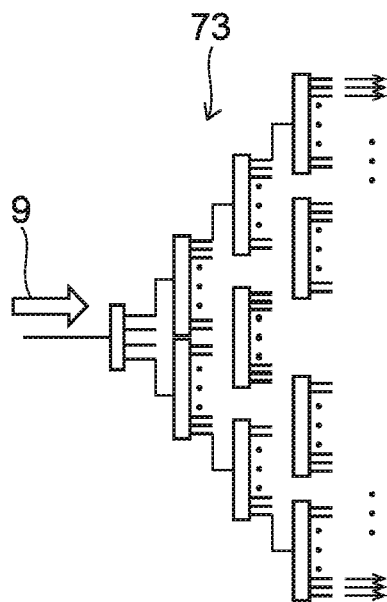
Figure 4C:
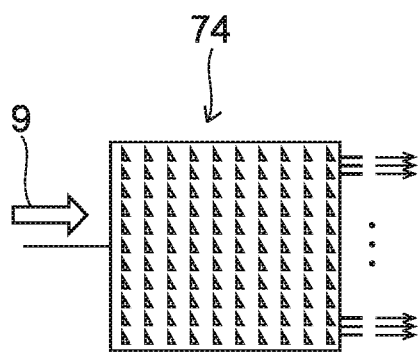

The light distributor 42 distributes, into a two-dimensional plane, the light coupled by the first optical coupler 41. FIGS. 4A to 4C are schematic views of the light distributor 42.

In the example shown in FIG. 4A, the light distributor includes multiple scattering bodies 72. The multiple scattering bodies 72 are dispersed in a transparent member 71. The scattering bodies 72 are, for example, holes. Or, the scattering bodies 72 are light-scattering particles.

In the example shown in FIG. 4B, the light distributor includes a multimode interference coupler 73 that uniformly distributes the input light into many optical waveguides.

In the example shown in FIG. 4C, the light distributor includes a photonic crystal 74 that includes structure bodies of the size of the wavelength of the light.

The modulator 43 performs intensity modulation of the light distributed by the light distributor 42. The light that is transmitted from the light source 10 to the modulator 43 is continuous light of a constant intensity. The modulator 43 converts the continuous light distributed by the light distributor 42 into an optical signal by modulating the intensity. For example, the modulator 43 switches the transmission of the light on and off.

For example, the modulator 43 is an element that utilizes the refractive index variation of a $LiNbO_3$ crystal due to an external electric field. Or, the modulator 43 is an element that utilizes the change of the optical absorption coefficient of a compound semiconductor due to an external electric field.

The second optical coupler 44 couples the output (the modulated light) of the modulator 43 to the light-receiving element 51. As described above, the light-receiving element 51 converts the modulated light into a current and applies a prescribed voltage to the deflection electrode 5.

Figure 5A:
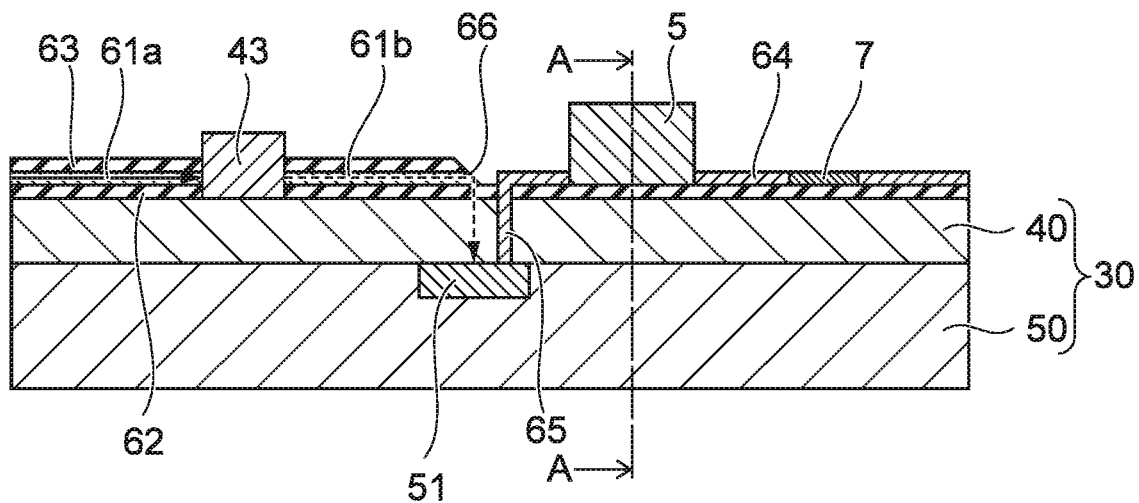
FIG. 5A is a schematic cross-sectional view of a coupling portion of a modulated light to a light-receiving element in the charged particle beam deflection device of the embodiment.
Figure 5B:
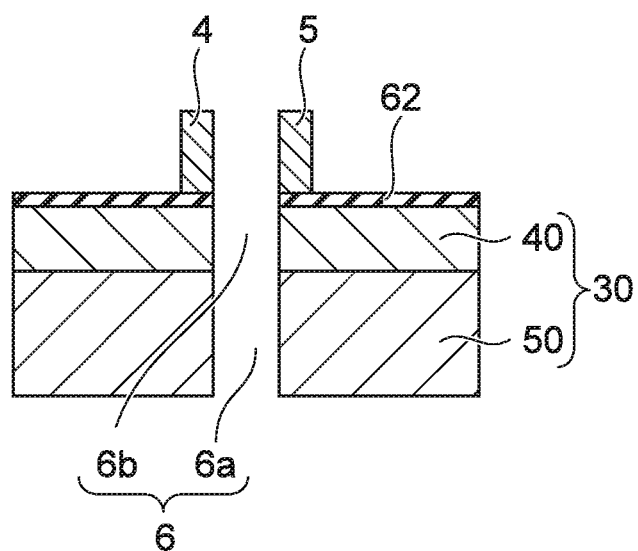
FIG. 5B is an A-A cross-sectional view of FIG. 5A.

FIG. 5A is a schematic cross-sectional view of the coupling portion of the modulated light to the light-receiving element 51 in the charged particle beam deflection device of the embodiment. FIG. 5B is an A-A cross-sectional view of FIG. 5A.

The first substrate 50 and the second substrate 40 are stacked with each other. As shown in FIG. 5B, the apertures 6 described above include a first aperture 6a that is provided in the first substrate 50, and a second aperture 6b that is provided in the second substrate 40. The first aperture 6a and the second aperture 6b are overlaid in the stacking direction of the first and second substrates 50 and 40 so that the positions are aligned. The first substrate 50 and the second substrate 40 are, for example, silicon substrates.

The light-receiving element 51 is formed at the front surface of the first substrate 50. The light-receiving element 51 is, for example, a p-n junction element of silicon or a compound semiconductor.

Optical waveguides 61a and 61b and insulating films 62 and 63 are formed on the second substrate 40. The insulating films 62 and 63 function as cladding. The optical waveguides 61a and 61b are formed between the insulating film 62 and the insulating film 63. The insulating films 62 and 63 are, for example, $SiO_2$ films. The optical waveguides 61a and 61b are, for example, SiON, SiN, or Si and have higher refractive indexes than the insulating films 62 and 63. Or, the optical waveguides 61a and 61b may be, for example, $SiO_2$ doped with B and/or Ge.

The optical waveguide 61a connects between the light distributor 42 and the modulator 43, and the continuous light propagates through the optical waveguide 61a. The optical waveguide 61b connects between the modulator 43 and the second optical coupler 44, and the modulated light (the optical signal) that is modulated by the modulator 43 propagates through the optical waveguide 61b.

In the example shown in FIG. 5A, for example, a 45° mirror formed of a metal film 66 is provided as the second optical coupler 44. The metal film 66 is, for example, a Au film or a Ag film. In other words, the second optical coupler 44 is a vertical coupler that optically couples the light propagating in the horizontal direction through the second substrate 40 to the vertical direction toward the light-receiving element 51 provided in the first substrate 50.

The deflection electrode 5 and the counter electrode 4 are provided on the second substrate 40. The deflection electrode 5 and the counter electrode 4 are, for example, metal members of Cu, Au, etc.

The deflection electrode 5 is connected to metal wiring 64 provided on the second substrate 40. Also, the deflection electrode 5 is electrically connected to the light-receiving element 51 via an electrode 65 extending through the second substrate 40.

The load resistance 7 is formed partway through the metal wiring 64. For example, the load resistance 7 is formed of polysilicon or a metal silicide.

According to the embodiment, the continuous light from the external light source 10 is distributed into a two-dimensional plane inside the charged particle beam deflection device, undergoes intensity modulation (is converted into optical signals), and is optically coupled to the light-receiving elements 51. It is unnecessary to provide multiple light sources that correspond to the light-receiving elements 51. Therefore, it is unnecessary to individually control multiple light sources corresponding to the number of the light-receiving elements 51, and the light-receiving elements 51 are not affected by the characteristic fluctuation of individual light sources. Thereby, in the embodiment, the light output of the light source 10 can be stabilized, and the stable operation of the individual blankers 52 is possible.

Figure 6:
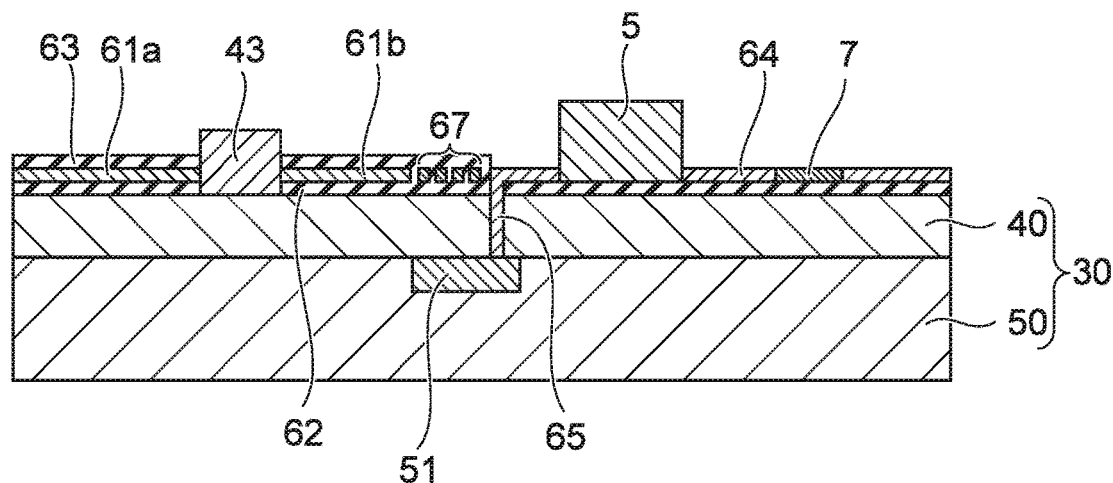
FIG. 6 is a schematic cross-sectional view of another example of a coupling portion of a modulated light to a light-receiving element in the charged particle beam deflection device of the embodiment.

FIG. 6 is a schematic cross-sectional view of another example of the coupling portion of the modulated light to the light-receiving element 51.

In the example shown in FIG. 6, a diffraction grating 67 in which the optical waveguide 61*b* is patterned into a periodic structure is provided as the second optical coupler 44. The diffraction grating 67 also is a vertical coupler that optically couples the light propagating in the horizontal direction through the second substrate 40 to the vertical direction toward the light-receiving element 51 provided in the first substrate 50.

Figure 7:
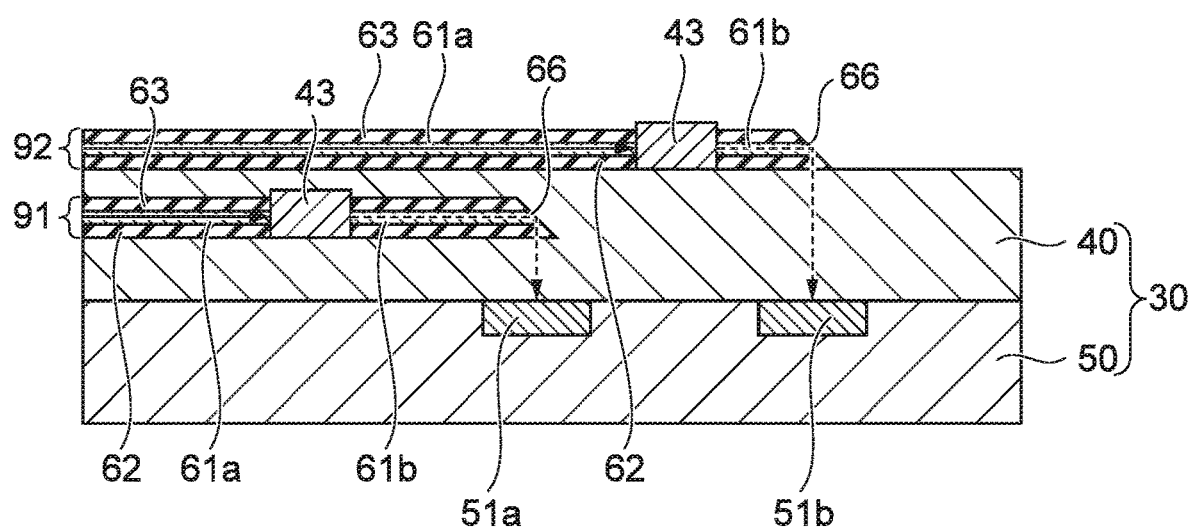
FIG. 7 is a schematic cross-sectional view of another example of a coupling portion of a modulated light to a light-receiving element in the charged particle beam deflection device of the embodiment.

FIG. 7 is a schematic cross-sectional view of another example of the coupling portion of the modulated light to the light-receiving element 51.

In the example shown in FIG. 7, the optical waveguides 61*a* and 61*b* that connect the light distributor 42 and the second optical coupler (the vertical coupler) 44 are provided at different multiple layers 91 and 92 on the second substrate 40.

The continuous light that propagates through the optical waveguide 61*a* provided in the first layer 91 is modulated by the modulator 43 provided in the first layer 91, and the modulated light is vertically coupled to a light-receiving element 51*a* provided in the first substrate 50 by, for example, the metal film 66 included in a 45° mirror provided in the first layer 91.

The continuous light that propagates through the optical waveguide 61*a* provided in the second layer 92, which is different from the first layer 91, is modulated by the modulator 43 provided in the second layer 92; and the modulated light is vertically coupled to a light-receiving element 51*b* provided in the first substrate 50 by, for example, the metal film 66 included in a 45° mirror provided in the second layer 92.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A charged particle beam deflection device, comprising:
a substrate;
a plurality of apertures provided in the substrate;
a plurality of electrodes deflecting charged particle beams passing through the apertures;
a plurality of light-receiving elements controlling voltages applied to the plurality of electrodes;
a first optical coupler coupling continuous light to the substrate;
a light distributor distributing light coupled by the first optical coupler into a two-dimensional plane;
a plurality of modulators performing intensity modulation of light distributed by the light distributor; and
a plurality of second optical couplers coupling the modulated light to the light-receiving elements.

2. The device according to claim 1, wherein
the substrate includes a first substrate and a second substrate,
the apertures include a first aperture provided in the first substrate, and a second aperture provided in the second substrate,
the first substrate and the second substrate are stacked with each other,
the first aperture and the second aperture are overlaid in a stacking direction of the first and second substrates,
the light-receiving elements are provided at the first substrate, and
the first optical coupler, the light distributor, the modulators, and the second optical couplers are provided at the second substrate.

3. The device according to claim 2, wherein
the second optical coupler is a vertical coupler coupling the modulated light propagating through an optical waveguide of the second substrate to the light-receiving element provided at the first substrate.

4. The device according to claim 3, wherein
the vertical coupler includes a mirror made of a metal film.

5. The device according to claim 3, wherein
the vertical coupler is a diffraction grating.

6. The device according to claim 3, wherein
optical waveguides connect the light distributor and the vertical couplers and are provided at a plurality of different layers on the second substrate.

7. The device according to claim 1, wherein
the light distributor includes a scattering body.

8. The device according to claim 1, wherein
the light distributor includes a multimode interference coupler.

9. The device according to claim 1, wherein
the light distributor includes a photonic crystal.

10. The device according to claim 1, wherein
the modulator switches a transmission of light on and off.

11. The device according to claim 1, wherein
the light-receiving element converts the modulated light into a current, and
the charged particle beam deflection device further includes a load resistance converting the current into a voltage applied to the electrode.

* * * * *